United States Patent [19]

Cornick

[11] Patent Number: 4,524,376

[45] Date of Patent: Jun. 18, 1985

[54] CORRUGATED SEMICONDUCTOR DEVICE

[75] Inventor: John A. Cornick, Manchester, England

[73] Assignee: U.S. Philips Corporation, New York, N.Y.

[21] Appl. No.: 610,917

[22] Filed: May 14, 1984

Related U.S. Application Data

[63] Continuation of Ser. No. 286,911, Jul. 27, 1981.

[30] Foreign Application Priority Data

Aug. 20, 1980 [GB] United Kingdom ............... 8027063

[51] Int. Cl.³ .......................................... H01L 29/06
[52] U.S. Cl. ........................................ 357/55; 357/20; 357/58
[58] Field of Search ................... 357/55, 20, 56, 60, 357/58

[56] References Cited

U.S. PATENT DOCUMENTS

| | | | |
|---|---|---|---|
| 3,150,999 | 9/1964 | Rudenberg et al. | 357/55 |
| 3,163,916 | 1/1965 | Gault | 357/55 |
| 3,363,151 | 1/1968 | Chopra | 357/55 |
| 3,454,835 | 7/1969 | Rosvold | 357/60 |
| 3,970,843 | 7/1976 | Dumas | 357/55 |
| 4,032,944 | 6/1977 | van Dongen et al. | 357/55 |
| 4,051,507 | 9/1977 | Rosvold | 357/60 |
| 4,135,950 | 1/1979 | Rittner | 357/55 |
| 4,277,793 | 7/1981 | Webb | 357/55 |

*Primary Examiner*—Martin H. Edlow
*Assistant Examiner*—Terri M. Henn
*Attorney, Agent, or Firm*—Paul R. Miller

[57] ABSTRACT

A semiconductor device, for example a p-i-n diode, comprises a corrugated semiconductor body having a plurality of complementary grooves and ridges on opposite sides of the body. The junction between the p-type region and the n-type intrinsic region has substantially the same configuration as, and extends substantially parallel to, the surface, while the junction between the n-type region and the intrinsic region similarly extends substantially parallel to the surface. Devices with narrow intrinsic regions can be made accurately by diffusion of the p-type region and the n-type region because the whole of the diode can be made relatively thin, for example, 90 micrometers without sacrificing strength and rigidity. In comparison with an equivalent planar device, the active area and current handling capability is increased. To avoid premature breakdown the diode may be surrounded by a thicker peripheral portion.

28 Claims, 10 Drawing Figures

CORRUGATED SEMICONDUCTOR DEVICE

This is a continuation of application Ser. No. 286,911, filed July 27, 1981.

The invention relates to a semiconductor device comprising a semiconductor body with two major surfaces, which device has at least one rectifying junction extending substantially parallel to at least one of the major surfaces, and an electrode on each of said major surfaces. The invention also relates to a method of manufacturing such a device.

BACKGROUND OF THE INVENTION

In the art of semiconductor manufacture it is known that the minimum thickness of a plane semiconductor body into which a semiconductor device is to be incorporated is restricted, in general, by the requirement for the body to be sufficiently rigid and robust so that it can be handled without breaking. This can mean that a device has to be made thicker than is necessary from a theoretical viewpoint. This is disadvantageous, firstly because more semiconductor material is used than is in fact required so that the device is more expensive than it need be. Secondly, some of the device characteristics may be adversely influenced. In practice, therefore, a compromise is reached between a device which is sufficiently thin for it to have acceptable device characteristics and a device which is sufficiently thick so that it can be handled without damage.

In order to illustrate these problems more clearly one particular semiconductor device, namely a semiconductor rectifier, will now be considered in more detail.

It is known that the reverse voltage at which a semiconductor rectifier breaks down can be increased by including in the semiconductor body of the rectifier a high resistivity intrinsic region between two semiconductor regions of opposite conductivity type. A semiconductor rectifier having this structure is known as a p-i-n diode. The voltage at which the device breaks down, the breakdown voltage as it is called, increases with increased width of the intrinsic region, which width is referred to hereinafter as the base width. However, the base width also adversely affects the forward current-voltage characteristic of the rectifier and so it is preferable that the base is not, or is not much wider than that necessary to obtain a device with the desired breakdown voltage. These base widths can be so small that it is difficult to make a device with optimum design. This is because regions of the body on each side of the base are of the n- and p-conductivity types respectively. Typically these regions are formed by diffusion. However, it is not possible to carry out deep diffusions accurately. In fact the deeper the diffusion the less well defined will be the positions of the junctions between the different regions and the consequence of poorly defined junction position is a device with poor and unpredictable characteristics. For a device which is to operate up to a given breakdown voltage and for which the optimum thickness of the body is less than that which is realizable in practice a compromise is made as follows. The intrinsic region is made sufficiently thin for the junctions between the different regions to be reasonably well defined in order to obtain low forward voltage drops while this same region is sufficiently thick to prevent breakdown at the desired operating voltages.

To avoid the difficulty of deep diffusions p-i-n diodes with relatively narrow base widths can be made using epitaxy to grow the intrinsic region on a relatively thick substrate of a first conductivity type. An epitaxial region of the opposite conductivity type is then grown on the intrinsic region. A p-i-n diode made using epitaxy is described in the Japanese Patent Application published under No. 55-18010. However, the device described there also includes a so-called 'wave-shaped' p-n junction which is said to reduce the forward voltage drop of the diode because of the decreased current density resulting from the increased junction area. As the diode is formed using epitaxy one of the major surfaces of the semiconductor body also has a wave shape, the depth of the waves being several micrometers. Despite this, the decreased current density is not a feature of the device as a whole because the opposite major surface of the completed diode is planar. Therefore, the current handling capability of the device is not altered by the wave-shaped junction and, moreover, the base width of the diode is not constant. Also, epitaxy is a relatively expensive technique and suffers from the drawback that, if there are any defects in the substrate, they can propagate through the structure as the epitaxial layers are grown. Furthermore, because the diode comprises a relatively thick substrate, it again includes more semiconductor material - and so is more expensive - than is necessary from the theoretical standpoint.

There is another problem associated with semiconductor rectifiers which either have a wave-structure as described in the above-mentioned Japanese Patent Application or which are formed from plane semiconductor bodies, namely premature breakdown. Because of surface field effects such devices tend to break down at the periphery before they do so at the center. One attampt to solve this problem is described in U.S. Pat. No. 3,428,870. The solution relies on forming a lower resistivity peripheral portion of the intrinsic region. However this provides no solution to solving the problem related to narrow base widths.

Another solution to the problem of premature breakdown is described in U.K. patent specification No. 1,105,177. In this case the plane semiconductor body is etched from one major surface to form a thinner central portion which is substantially flat and which is surrounded by a thicker peripheral portion. The region adjoining the etched surface is diffused in after etching so that it is of uniform thickness throughout the body. The opposite conductivity type region adjoining the other surface is also of uniform thickness. Consequently the intrinsic region comprises a thin central portion surrounded by a thicker peripheral portion. The voltage at which the peripheral portion breaks down can thus be increased so that it does not break down before the central portion. Clearly this solution also goes some way to solving the problem of narrow base widths, the thicker peripheral portion gives a degree of rigidity to the thinned device. However, particularly in the case of large area devices for handling large currents across the device, the minimum thickness is still restricted by the requirement for mechanical strength and rigidity so that the compromise mentioned above must still be made to some extent.

SUMMARY OF THE INVENTION

According to a first aspect of the invention a semiconductor device comprising a semiconductor body having two major surfaces, wherein a plurality of grooves and ridges is present on one side of at least part of the semiconductor body, with the walls of the grooves and ridges forming at least part of a first of the two major surfaces, which device has at least one rectifying junction having substantially the same configuration as and extending substantially parallel to the first major surface, and an electrode on each of the two major surfaces, is characterized in that a plurality of complementary grooves and ridges is present on the side of the semiconductor body part opposite the one side with the walls of the complementary grooves and ridges forming at least part of the second of the two major surfaces of the semiconductor body, and in that the perpendicular thickness of the semiconductor body part is substantially uniform.

Because the grooves and ridges are formed on both sides of the semiconductor body it takes on a corrugated form. Thus the semiconductor device can be made strong and rigid even when the perpendicular thickness is, for example less than 100 microns and when the device covers a large area.

Also, because the walls of the grooves and ridges form at least part of both major surfaces of the semiconductor body these surfaces have a greater area than the major surfaces of a prior art device having the same lateral dimensions. Thus a device in accordance with the invention has a greater active area so that its current handling capabilities are increased. In other words a device in accordance with the invention and which is manufactured from a semiconductor body of a given thickness has a greater active area and accordingly is more economical than a prior art device manufactured from a semiconductor body of the same thickness.

In addition, the grooves facilitate bonding of the semiconductor device to, for example, a header because the bonding medium, which may be a solder, tends to flow by capillary action along the grooves to improve the bond.

Preferably, each of the grooves has a flat bottom and plane sides converging towards this flat bottom. Thus the p-n junction, being parallel to the walls of the grooves and ridges on at least one side of the semiconductor body, need not change direction in an abrupt manner. This tends to avoid the problems associated with concentrated electric fields which can occur when the direction of a p-n junction changes abruptly.

Also, it is preferable when the grooves and ridges are arranged in mutually parallel straight lines. This is a particularly straight-forward configuration to manufacture accurately.

To avoid premature breakdown the semiconductor device may comprise a peripheral portion whose thickness is greater than the perpendicular thickness of the part of the body in which the grooves and ridges are present. In the manufacture of such a device it is not necessary to include any extra processing steps to form this peripheral portion.

The invention is applicable to semiconductor devices having one or more rectifying junctions, such as diodes, transistors, thyristors and triacs.

According to a further aspect of the invention a method of manufacturing a semiconductor device in accordance with the first aspect of the invention is characterized by the steps of forming a plurality of complementary ridges and grooves on two opposite sides of at least part of a semiconductor body with the walls of the grooves and ridges on each side respectively forming at least part of the two major surfaces, subsequently introducing into the semiconductor body a dopant characteristic of the first conductivity type to form a region of the first conductivity type adjoining the first major surface of the semiconductor body with the region forming with an adjacent region of the opposite conductivity type a rectifying junction which has substantially the same configuration as and extends substantially parallel to the first major surface, and providing an electrode on each of the two major surfaces of the semiconductor body.

This method is relatively inexpensive and avoids the problem of defect propagation associated with epitaxy. Also, in the case of a p-i-n diode it is possible to manufacture a device in accordance with the invention such that the base width is no greater than it need be for the desired characteristics and so that the regions of opposite conductivity type, which are formed by diffusion, are shallow enough to form accurately positioned junctions. Thus it is not necessary to make the compromise which had to be made with prior art devices employing diffusion in their manufacture.

BRIEF DESCRIPTION OF THE DRAWINGS

Embodiments of the invention will now be described by way of example with reference to the accompanying drawings, in which.

DESCRIPTION OF THE PREFERRED EMBODIMENTS

Figure 1:
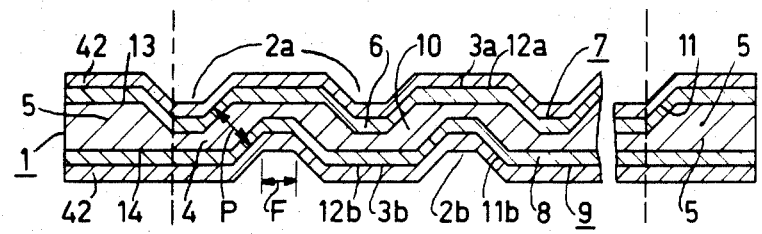
FIG. 1 is a cross-sectional view of part of a diode in accordance with the invention.
Figure 2:
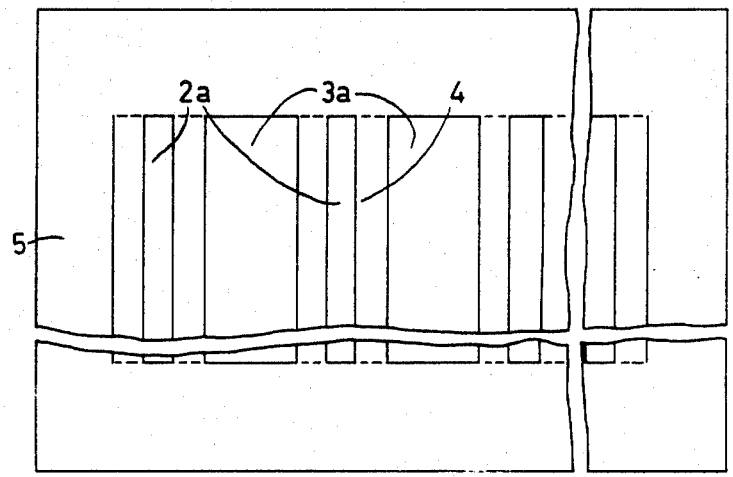
FIG. 2 is a plan view of the part of the diode of FIG. 1.

FIGS. 1 and 2 show a rectifier in the form of a p-i-n diode comprising a corrugated silicon body 1 having a square outline. A plurality of complementary grooves 2a, 2b and ridges 3a, 3b is present on opposite sides of the central part 4 of the body 1. The grooves and ridges are said to be complementary because the centers of the grooves 2a and the ridges 3a on one side of the body are directly opposite the centers of the ridges 3b and the grooves 2b respectively on the other side. The perpendicular thickness p, that is to say the thickness measured at right angles to the major surfaces 7 and 9, of the central part 4 of the semiconductor body in uniform. In the Figures the broken lines divide the central, corrugated part 4 of the body from the peripheral portion 5 whose thickness is greater than the perpendicular thickness of part 4. In this embodiment the grooves 2a, 2b and the ridges 3a, 3b are arranged in mutually parallel straight lines.

A p-type region 6 adjoins the major surface 7 of the semiconductor body and an n-type region 8 adjoins the major surface 9. Between regions 6 and 8 is an intrinsic silicon region 10 of the n-conductivity type. This region 10 is the base region of the p-i-n diode. The regions 6 and 8 are substantially uniformly thick so that the base width of the intrinsic region 10 is greater in the peripheral part 5 than it is in the central part 4. The effect of this is that the diode can have a greater breakdown voltage at the periphery than at the center of the device. Consequentyly the device need not break down at the periphery before it does so at the central part. The walls 11a of the grooves and the walls 12a of the ridges form the central part of the major surface 7 while the walls 11b of the grooves and the walls 12b of the ridges form the central part of the major surface 9.

Electrodes 42 are present on each of the major surfaces 7 and 9 of the semiconductor body so that during operation current flows across the semiconductor body 1 between these major surfaces over the whole area of the device.

The rectifying junction, that is to say the p-n junction 13, is of substantially the same area as the major surface 7 and is everywhere substantially parallel to the major surface 7. Similarly, the junction 14 between the n-type region 8 and the intrinsic region 10 is everywhere parallel to the major surface 9.

Each of the grooves 2a and 2b has a flat bottom with plane converging sides. The p-n junction 13 has substantially the same configuration as and, as mentioned above, is substantially parallel to the major surface 7, but the direction of this p-n junction 13 does not change abruptly. This is particularly favourable because it tends to avoid the formation of localized high electric fields which could cause premature breakdown of the device. The grooves 2 and ridges 3 are arranged in mutually parallel straight lines. This configuration is particularly straightforward to manufacture accurately.

A method of making the p-i-n diode of FIGS. 1 and 2 will now be described with reference to FIGS. 3 to 6.

Figures 3, 9:
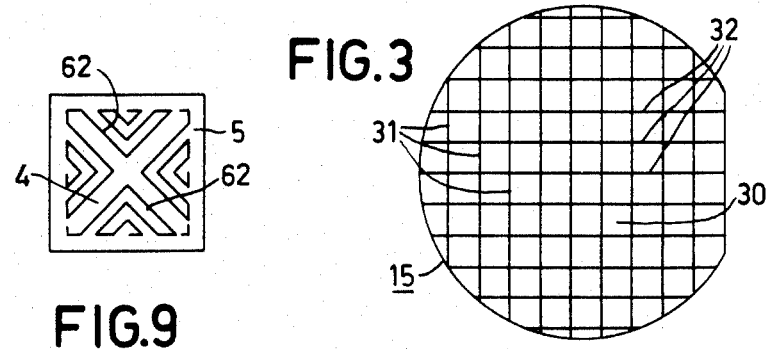
FIG. 3 is a plan view of a semiconductor wafer in which a plurality of these diodes is to be formed.
FIG. 9 is a plan view of a diode in accordance with the invention having a different arrangement of grooves and ridges.

The starting material is an intrinsic silicon wafer 15 having plane mutually parallel major surface 20 and 21 which are parallel to the (100) plane or one of the equivalent planes. Although theoretically an intrinsic semiconductor is a pure semiconductor which, under conditions of thermal equilibrium, has an equal hole and electron density, in practice absolute purity is unattainable. In general the term "intrinsic" is applied to semiconductors which have a high resistivity because they have a high degree of purity or because they are only slightly doped. The silicon wafer 15 which has a substantially circular outline as shown in FIG. 3 may, for example, be of the n-conductivity type with a resistivity of 60 ohm.cm. The diameter of the wafer 15 is, for example 7.62 cm. and its initial thickness may be about 320 microns. The wafer 15 is etched in nitric acid and hydrofluoric acid to remove surface damage thus reducing its thickness to, for example, 230 microns.

Figure 4:
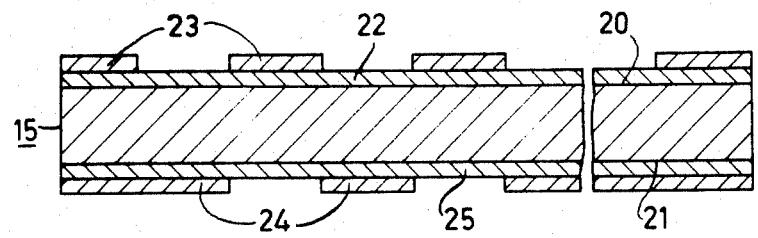
FIGS. 4 to 6 show various stages in the manufacture of the diode of FIGS. 1 and 2.
Figure 5:
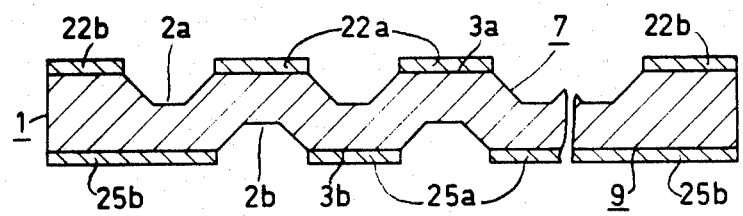
Figure 6:
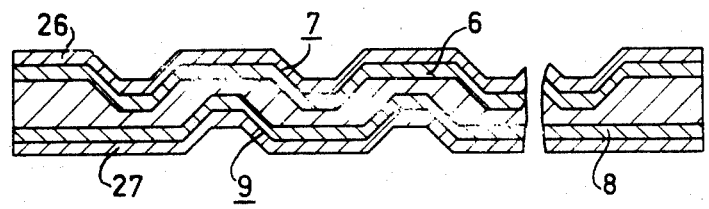

For the sake of clarity FIGS. 4 to 6 show stages in the manufacture of a single diode. However, in practice a plurality of diodes is formed simultanteously on the wafer 15, as shown in FIG. 3. One diode is formed at each of the areas 30 which may be, for example, 4mm. square (see FIG. 3).

Oxide layers 22 and 25, which may be 1 micron thick are formed in known manner on the two sides 20 and 21 respectively of the wafer 15 (see FIG. 4). A layer of photosensitive resist of the negative type is then deposited on both oxide layers in known manner. Using a double sided photo-mask aligner in known manner, the resist is exposed and developed to form the masks 23 and 24 on the oxide layers 22 and 25 respectively. The gaps between the remaining parts of the resist correspond to those areas where grooves are to be formed.

These masks 23 and 24 are now used to mask the subjacent oxide layers 22 and 25 against an etchant, in this case hydrofluoric acid, to define the oxide portions 22a, 22b and 25a, 25b respectively (see FIG. 5). The portions 22a and 25a may be 150 microns wide and spaced apart by 260 microns with the portions 22a on the side 20 of the wafer being located mid-way between the portions 25 on the opposite side 21. Similarly the portions 22a are mid-way between the portions 25a. The oxide portions 22b and 25b define the width of the thick peripheral portion of the diode. In general the peripheral portion is chosen to be sufficiently wide to give rigidity and mechanical strength to be finished device and to provide a sufficiently large area for passivation if required. In the case where nine grooves are to be formed in the side 20 and eight grooves are to be formed in the side 21 and with the dimensions so far considered the portion 22b of the mask may be 230 microns wide and the portion 25b may be 435 microns wide. In other words, the portions 22b and 25b extend up to the scribing lanes 31 and 32 (see FIG. 3) where the wafer eventually will be severed to separate the individual diodes formed at each of the areas 30.

The next step in the method is the formation of the grooves. In this embodiment an anisotropic etchant is used which preferentially etches the silicon along the (111) plane. The etchant consists of 75 ml of ethylene diamine, 24 g of pyrocatechol, 0.45 of pyrazene and 25 ml of water. The etching is carried out at both sides of the wafer to form the grooves 2a and 2b simultaneously. The etching is stopped when the depth of the grooves is such that the perpendicular thickness of the whole of the central part 4 of the silicon body is uniform. In this case the grooves are formed with flat bottoms and, because ethylene diamine is used as an anisotropic etchant, with plane converging sides. The grooves are 140 microns deep and the perpendicular thickness of this central part is 90 microns. At this stage the bottom of the groove, which is parallel to the (100) plane is 60 microns wide. Thus the ridges 3a are formed between adjacent grooves 2a and ridges 3b are formed between adjacent grooves 2b.

It is noted here that anisotropic etchants can be used in a self-terminating way because etching stops automatically when the sides of the groove, in this case the (100) planes, meet each other. This avoids the need for careful timing of the etching operation. The grooves thus formed have a 'V' shape in cross-section. By choosing the width and spacing of the grooves appropriate to the starting thickness of the semiconductor wafer a device in accordance with the invention can be manufactured using an anisotropic etchant in this self-terminating manner.

After the grooves have been etched the p and n type regions 6 and 8 respectively are formed by diffusion. For example, as shown in FIG. 6 a layer 26 of phosphorus doped silox is deposited on the surface 7 and a layer 27 of boron doped silox is deposited on surface 9. The phosphorus and boron impurities are diffused into the silicon body to a depth of about 20 microns by heating at approximately 1250° C. for about 4 hours. Thus the p-type region 6 and the n-type region 8 are formed. The perpendicular thickness of the central corrugated part of the body is 90 microns so that the base width, that is, the width of the intrinsic region is about 50 microns.

Figure 7:
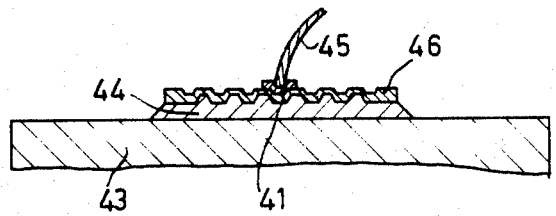
FIG. 7 is a cross-sectional view of the diode of FIGS. 1 and 2 bonded to a header.

After removal of the silox using hydrofluoric acid the device may be passivated, if so desired, to enhance the long term stability of the breakdown voltage. The electrodes 42 (see FIG. 1) are then formed on each of the major surfaces 7 and 9 of the semiconductor body by metallizing in known manner with, for example, an alloy of chromium, nickel and gold. The contact 41 is then formed on the metallized surface 7 in known manner (see FIG. 7). It may be desirable to provide the contact 41 on a plane surface. Therefore, if the electrode 41 is large relative to the size of the grooves 2a, one or more grooves may be omitted from the upper side of the device. The individual diodes are then separated by sawing along the orthogonal sets of scribing lanes 31 and 32 (see FIG. 3).

The metallized diode 46 may then be soldered to a header 43 using a conventional solder 44. In the soldering operation the solder 44 flows by capillary action along the grooves on the side of the diode being soldered. This effect improves the bond between the diode and the header.

A wire connection 45 may then be made between the electrode 41 and a lead of the header after which encapsulation of the diode is completed in the usual manner.

The diode described above is such that, upon application of a reverse voltage of about 1000 V, avalanche breakdown occurs in the thinner central portion 4 before occurring at the peripheral portion 5. Thus the base width of the device is reduced for improved forward voltage characteristics while maintaining high breakdown capabilities.

Figure 8:
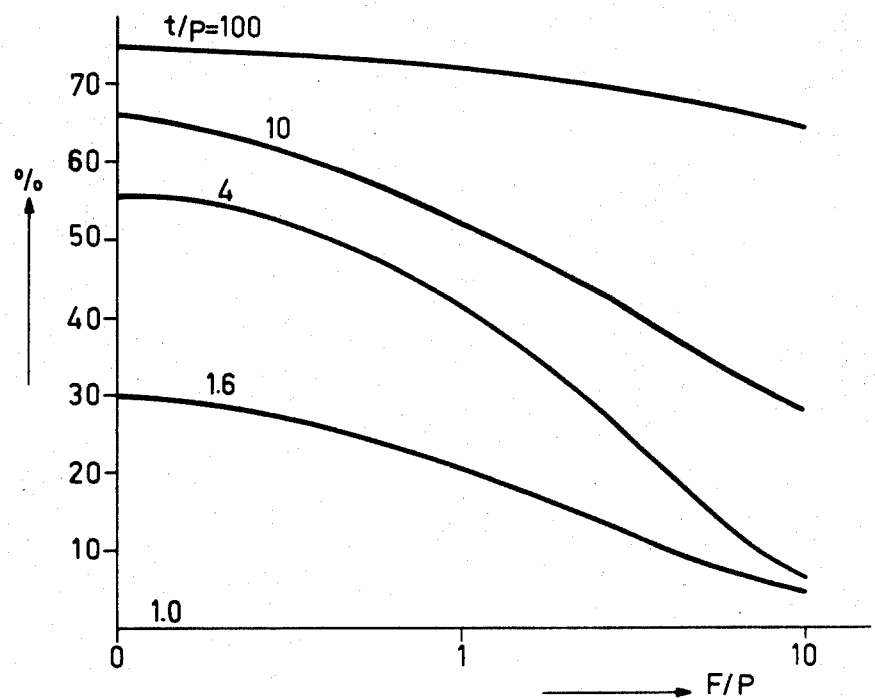
FIG. 8 is a graph showing the gain in active area of a device in accordance with the invention compared with a conventional plane device.

Also with this diode the active area for conduction is increased as compared with a conventional plane device having the same lateral dimensions. This is illustrated by the graphs of FIG. 8 in which the vertical axis represents the percentage increase in active area and the horizontal axis represents the quotient F/p where F is the width of the bottom of a groove (see FIG. 1) and p is the perpendicular thickness of the corrugated part of the body. Various graphs are plotted for different values of t/p (where t is the initial thickness of the semiconductor wafer) ranging from 1 to 100. Clearly t/p=1 represents a conventional plane device. In this case there is no increase in active area so that the graph runs along the horizontal axis. However it can be seen from FIG. 8 that a device in accordance with the invention can result in substantial increases in active area.

The p-i-n diode described above is only one example of a diode in accordance with the invention. Having described this diode in detail it will be evident to the person skilled in the art that other examples are Zener and Schottky diodes. In the case of Schottky diodes the rectifying junction is formed between one of the electrodes on one of the major surfaces of the semiconductor body and the subjacent semiconductor body itself. Therefore the rectifying junction is parallel to one of these major surfaces in the sense that it is coincident with it.

Figure 10:
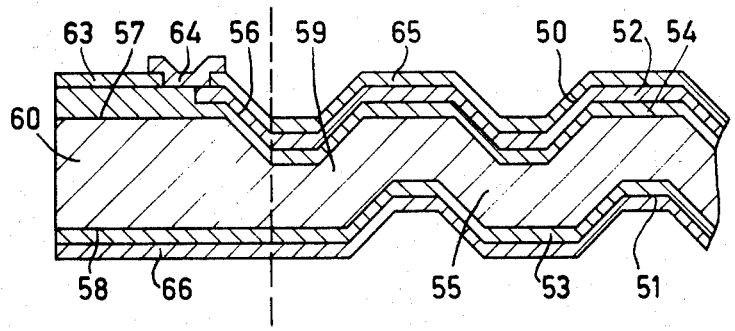
FIG. 10 is a cross-sectional view of a thyristor in accordance with the invention.

However, the invention is not restricted to diodes. Other devices which are within the scope of the invention may have more than one p-n junction, for example thyristors, asymmetrical thyristors, triacs and transistors. To illustrate this FIG. 10 shows a part of a thyristor in accordance with the invention. It is clear that the advantage of reduced device width with attendant mechanical strength together with increased conducting area are also present in this device.

The thyristor of FIG. 10 has a highly doped n-region 52 adjoining the major surface 50 and a highly doped p-type region 53 adjoining the opposite major surface 51. Between the regions 52 and 53 there is a region 54 of the p-conductivity type and a region 55 of the n-conductivity type. P-n junctions 56, 57 and 58 are formed between the regions 52 and 54, 54 and 55, and 55 and 53 respectively. The junctions 56 and 57 have substantially the same configuration as and extend substantially parallel to the major surface 50 while the junction 58 similarly extends substantially parallel to the surface 51. Thus in the central portion 59 of the semiconductor body the perpendicular thickness of all of the regions 52, 53, 54, 55 is uniform whereas in the thicker peripheral portion 60 this is not the case for the region 55 which is thicker here than in the portion 59. Electrodes 65 and 66 are present on the opposite major surfaces 50 and 51 respectively. Electrode 65 contacts the n-type cathode region 52 while electrode 66 contacts the p-type anode 53. A peripheral electrode 63, which in this case is annular, contacts the p-type gate region 54. The electrodes 63 and 65 are insulated from each other by an insulating layer 64. The manner in which this thyristor can be manufactured will be evident to the person skilled in the art in the light of the above description concerning the manufacture of a p-i-n diode.

In general, the invention is not restricted to corrugated semiconductor bodies where the grooves are arranged in parallel straight lines. On the contrary many groove configurations are possible. As one example the grooves may be arranged symmetrically in four sets of several interlocking chevrons 62 which extend towards the center of the device as shown in FIG. 9. This arrangement may be desirable in a device where increased strength and rigidity are required. Of course the grooves may be of different widths on either or both sides of the device. Similarly, the grooves may be of a shape different from that described above depending on how they are formed. For example the grooves may have sides which are perpendicular to the major surfaces of the body from which the device is formed, and bottoms which are perpendicular to the sides. In a particularly simple form of a device in accordance with the invention there may be two grooves on one side of the semiconductor body and only a single groove on the opposite side.

I claim:
1. A semiconductor device comprising
a semiconductor body having two major surfaces,
a first of said two major surfaces having a first plurality of grooves and ridges, and a second of said two major surfaces having a second plurality of grooves and ridges, said second plurality of grooves and ridges being offset to said first plurality of grooves and ridges, and said second plurality of grooves and ridges being opposite to said first plurality of ridges and grooves respectively,
a first region of one conductivity type adjoining said first of said two major surfaces, and said first region having the same configuration as said first plurality of grooves and ridges,
a second region of an opposite conductivity type adjoining said second of said two major surfaces, and said second region having the same configuration as said second plurality of grooves and ridges,
at least one rectifying junction having the same configuration as and extending parallel to said first major surface below said first region, an electrode covering each of said two major surfaces, wherein said semiconductor body has a thickness perpendicular to said two major surfaces with said thickness being uniform between said grooves and ridges of said first of said two major surfaces and said ridges and grooves respectively of said second of said two major surfaces.

2. A semiconductor device according to claim 1, wherein each of said grooves has a flat bottom and plane sides converging toward said bottom.

3. A semiconductor device according to claim 2, wherein said grooves and ridges are arranged in mutually parallel straight lines at each surface of said semiconductor body.

4. A semiconductor device according to claim 3, wherein said rectifying junction has the same area as one of said two major surfaces.

5. A semiconductor device according to claim 4, wherein said semiconductor body includes a peripheral portion having a thickness greater than said thickness perpendicular to said two major surfaces at said grooves and ridges.

6. A semiconductor device according to claim 5, wherein said first region has a uniform thickness, said second region has a uniform thickness, and a high resistivity region lies between said first and second regions.

7. A semiconductor device according to claim 6, wherein said high resistivity region is of n-conductivity type.

8. A semiconductor device according to claim 7, wherein a plurality of p-n junctions are provided, and wherein said plurality extend parallel to and with the same configuration as at least one of said two major surfaces.

9. A semiconductor device according to claim 4, wherein a plurality of p-n junctions are provided, and wherein said plurality extend parallel to and with the same configuration as at least one of said two major surfaces.

10. A semiconductor device according to claim 3, wherein a plurality of p-n junctions are provided, and wherein said plurality extend parallel to and with the same configuration as at least one of said two major surfaces.

11. A semiconductor device according to claim 4, wherein said first region has a uniform thickness, said second region has a uniform thickness, and a high resistivity region lies between said first and second regions.

12. A semiconductor device according to claim 11, wherein said high resistivity region is of n-conductivity type.

13. A semiconductor device according to claim 4, wherein a plurality of p-n junctions are provided, and wherein said plurality extend parallel to and with the same configuration as at least one of said two major surfaces.

14. A semiconductor device according to claim 3, wherein said semiconductor body includes a peripheral portion having a thickness greater than said thickness perpendicular to said two major surfaces at said grooves and ridges.

15. A semiconductor device according to claim 3, wherein said first region has a uniform thickness, said second region has a uniform thickness, and a high resistivity region lies between said first and second regions.

16. A semiconductor device according to claim 15, wherein said high resistivity region is of n-conductivity type.

17. A semiconductor device according to claim 3, wherein a plurality of p-n junctions are provided, and wherein said plurality extend parallel to and with the same configuration as at least one of said two major surfaces.

18. A semiconductor device according to claim 2, wherein said rectifying junction has the same area as one of said two major surfaces.

19. A semiconductor device according to claim 2, wherein said semiconductor body includes a peripheral portion having a thickness greater than said thickness perpendicular to said two major surfaces at said grooves and ridges.

20. A semiconductor device according to claim 2, wherein said first region has a uniform thickness, said second region has a uniform thickness, and a high resistivity region lies between said first and second regions.

21. A semiconductor device according to claim 20, wherein said high resistivity region is of n-conductivity type.

22. A semiconductor device according to claim 2, wherein a plurality of p-n junctions are provided, and wherein said plurality extend parallel to and with the same configuration as at least one of said two major surfaces.

23. A semiconductor device according to claim 1, wherein said grooves and ridges are arranged in mutually parallel straight lines with respect to each other at each surface of said semiconductor body.

24. A semiconductor device according to claim 1, wherein said rectifying junction has the same area as one of said two major surfaces.

25. A semiconductor device according to claim 1, wherein said semiconductor body includes a peripheral portion having a thickness greater than said thickness perpendicular to said two major surfaces at said grooves and ridges.

26. A semiconductor device according to claim 1, wherein said first region has a uniform thickness, said second region has a uniform thickness, and a high resistivity region lies between said first and second regions.

27. A semiconductor device according to claim 26, wherein said high resistivity region is of n-conductivity type.

28. A semiconductor device according to claim 1, wherein a plurality of p-n junctions are provided, and wherein said plurality extend parallel to and with the same configuration as at least one of said two major surfaces.

* * * * *